United States Patent [19]

Loxley et al.

[11] Patent Number: 5,389,582

[45] Date of Patent: * Feb. 14, 1995

[54] CRISTOBALITE REINFORCEMENT OF QUARTZ GLASS

[76] Inventors: Ted A. Loxley; John F. Blackmer, both of 3985 Ben Hur Ave., Willoughby, Ohio 44094

[*] Notice: The portion of the term of this patent subsequent to Oct. 1, 2008 has been disclaimed.

[21] Appl. No.: 767,691

[22] Filed: Sep. 30, 1991

Related U.S. Application Data

[60] Continuation-in-part of Ser. No. 523,982, May 16, 1990, Pat. No. 5,053,359, which is a division of Ser. No. 328,773, Mar. 24, 1989, abandoned, which is a continuation of Ser. No. 225,051, Jul. 27, 1988, abandoned, which is a continuation of Ser. No. 795,645, Nov. 6, 1985, abandoned.

[51] Int. Cl.⁶ ............... C03C 10/14; C03B 37/00
[52] U.S. Cl. ............................................. 501/4; 501/8; 65/17.3; 164/39; 432/262
[58] Field of Search ............... 501/4, 8; 65/2, 13, 65/33, 108; 164/139; 432/262

[56] References Cited

U.S. PATENT DOCUMENTS

| | | | |
|---|---|---|---|
| 3,557,575 | 1/1971 | Beall | 65/33 |
| 3,652,248 | 3/1972 | Loxley et al. | 65/13 |
| 3,776,809 | 12/1973 | Baumler et al. | 65/33 |
| 3,799,836 | 3/1974 | Rogers et al. | 65/33 |
| 3,881,945 | 5/1975 | Trojer et al. | 501/4 |
| 3,929,497 | 12/1975 | Clark-Monks | 65/33 |
| 3,972,704 | 8/1976 | Loxley et al. | 65/157 |
| 4,008,094 | 2/1977 | Beall et al. | 106/99 |
| 4,042,362 | 8/1977 | MacDowell et al. | 65/33 |
| 4,093,017 | 6/1978 | Miller et al. | 164/28 |
| 4,199,336 | 4/1980 | Rittler | 65/2 |
| 5,053,359 | 10/1991 | Loxley et al. | 501/4 |

OTHER PUBLICATIONS

"Glass: Science and Technology", vol. 1, 1983, pp. 122–123, 128–129, 147, 182, 415, 442 and 443 (No Month).
"Fiberglass", Mohr et al, 1978, pp. 122–124 and 205–207 (No Month).
"Encyclopedia of Chem. Tech.", Kirk Othmer, 3rd Ed., 1979 pp. 693–694 (No Month).
"Handbook of Glass Manufacture", Tooley, 1974, pp. 742–745, 901, 934 and 935 (No Month).

*Primary Examiner*—Anthony Green
*Attorney, Agent, or Firm*—Vincent A. Greene

[57] ABSTRACT

Unique cristobalite-seeded quartz glass crucibles and cores admirably suited for Cz crystal growing and D.S. metal casting are formed by slip casting using a slurry containing a quartz refractory composition comprising silica particles with an average particle size of from 1 to 10 microns and a minute but effective amount of micronized dispersible particles of a unique crystallization aid, such as basic aluminum acetate, which provides the glass with at least 0.005 percent by weight of evenly dispersed metallic ions. The metallic ions provide the quartz glass with nucleation sites so that heating of the glass to a temperature of from 1200° C. to 1250° C. permits formation of a high concentration of evenly dispersed cristobalite nuclei in the glass without causing excessive devitrification prior to cooling of the seeded glass. The desired nucleation sites can also be provided by using micronized particles of alpha quartz or alpha cristobalite.

28 Claims, No Drawings

CRISTOBALITE REINFORCEMENT OF QUARTZ GLASS

This application is a continuation-in-part of appplication Ser. No. 523,982 (filed May 16, 1990), now U.S. Pat. No. 5,053,359, which is a division of application Ser. No. 328,773 (filed Mar. 24, 1989), which is a continuation of application Ser. No. 225,051 (filed Jul. 27, 1988), which is a continuation of application Ser. No. 795,645 (filed Nov. 6, 1985), the last three all now abandoned.

The present invention relates to the use of cristobalite in refractory quartz glass articles and in high temperature processes such as are used in the semiconductor industry and in the investment casting industry. It involves the manufacture or fabrication of a wide variety of refractory articles. One embodiment of the invention relates to a unique crucible for use in a Czochralski (Cz) crystal-growing process.

BACKGROUND OF THE INVENTION

While cristobalite has certain advantageous physical properties at high temperatures, it creates serious problems in refractory silica articles because of the extreme volume changes during the crystallographic alpha-beta inversion. The inversion is too often catastrophic in high-density glass products.

The damage caused during the inversion is less severe in a highly porous product so that minor amounts of cristobalite can be tolerated in a ceramic core for metal casting. In modern processes for investment casting of turbine engine parts, such as the well-known directional solidification (D.S.) process, where metal casting temperatures exceed 1500° C., special cores are required which have adequate high-temperature sag-resistance to maintain their shape. One proposed solution to the problem is disclosed in U.S. Pat. No. 4,093,017 wherein a porous ceramic core formed of vitreous silica is provided with small amounts of a metal-oxide mineralizer or crystallization aid to promote the growth of cristobalite.

Unfortunately the process disclosed in that patent cannot be used in silica glass cores sintered to a density of 90 to 95 percent or more because of the catastrophic alpha-beta inversion which occurs when crystalline silica is heated or cooled through the temperature range of 150° to 300° C.

Prior to the present invention, cristobalite has always been considered intolerable in quartz glass crucibles used for growing silicon monocrystal by the Czochralski (Cz) process. The semi-conductor industry has insisted that slip-cast glass crucibles used in Cz crystal-growing furnaces be sintered at a temperature above 1750° C. long enough to eliminate all of the crystalline silica. The industry could not cope with the problems associated with cristobalite and did not know how to obtain commercial benefits from this troublesome crystalline material.

Copending patent application Ser. No. 523,982 filed May 16, 1990 (U.S. Pat. No. 5,053,359) discloses a unique process for making cristobalite crucibles for use in the Cz process using aluminum hydroxide as a crystallization aid. Prior to the present invention, that process has had limited value and has been somewhat unreliable because of problems encountered when using conventional slip-casting methods.

The entire disclosure of said application Ser. No. 523,982 including the drawings is incorporated herein by reference and made a part of the present application to facilitate an understanding of the nature and background of the present invention.

The commercial advantages of slip-casting, which may be suggested by that application, are not achieved in a satisfactory manner in the manufacture of Cz crucibles when using fine particles of crystallization aids, such as aluminum oxide or aluminum hydroxide, which tend to agglomerate in a slurry or slip or which cannot be homogeneously dispersed in the slurry.

Unfortunately slip casting with a slurry having a pH of 10 or higher is not feasible. At the preferred pH of 7 to 8, fine particles of aluminum oxide or aluminum hydroxide will agglomerate and cannot be dispersed as discrete particles to provide a stable homogeneous suspension of the type preferred for slip casting. The agglomeration problem is reduced by raising the pH to 12 or higher, but that would not be acceptable in a slurry used for slip casting or electrophoretic deposition.

SUMMARY

The present invention is a giant step forward in the field of silica technology and makes it possible to achieve a dramatic change in the high temperature properties of silica glass by formation of cristobalite while retaining high strength and advantageous thermal shock properties and avoiding serious damage due to the crystallographic alpha-beta inversion.

The invention provides a means for solving problems in the field of high-temperature refractories which heretofore appeared to be insuperable. It provides a unique process for fabricating a variety of silica glass products having outstanding properties at temperatures above 1500° C.

In the semiconductor industry, particularly in the field of microelectronics, the invention could be a potential breakthrough, especially with respect to the problem of melt contamination during Cz crystal growing. For some reason, the smooth inner surface of a crucible made according to the invention, when converted to cristobalite, is very durable and has a resistance to attack by molten silicon much greater than that of vitreous silica. This can more than double the useful life of the crucible.

The present invention involves the basic discovery that full-density quartz glass can retain thermal shock resistance and essentially all of the important advantages of vitreous silica and yet be converted to cristobalite without significant problems due to the alpha-beta inversion. A basic part of the solution to the problem is a seeding technique which provides a high concentration of cristobalite nuclei uniformly dispersed throughout the glass without forming an intolerable amount of cristobalite during manufacture.

The basic features in one embodiment of the invention include use of a suitable dispersible crystallization aid in the quartz refractory composition to promote the growth of cristobalite, and a nucleation heat-treatment to provide the necessary cristobalite nuclei without causing an intolerable amount of devitrification. An important commercial advantage of the invention is that it permits reliable manufacture of high-purity quartz crucibles of the highest quality using economical slip-casting techniques.

A number of different embodiments of the invention incorporate the basic features described above. In the case of drawn filaments or drawn tubing for use in refractory cores, the oriented striations in the glass provide sites for nucleation. Seeding of the glass can be effected in different ways as described hereinafter.

A unique and important feature of one embodiment of the invention is the use of unique crystallization aids including micronized dispersible particles of water-insoluble metal salts or other materials that facilitate homogeneous distribution in the slurry, such as particles of basic aluminum acetate, an alumino-silicate, zirconium silicate, or a special silica-metal compound containing a substantial percentage of aluminum oxide or other suitable metal oxide that promotes the growth of cristobalite.

In another embodiment of the invention the micronized dispersible particles used in the slurry consist of crystalline silica (e.g., alpha quartz), thus avoiding the introduction of aluminum ions and making it possible to provide quartz glass crucibles with a purity in excess of 99.99 percent.

Other refinements disclosed herein make it possible to produce reliable Cz crucibles of transparent bubble-free quartz glass which can readily be converted to cristobalite.

DEFINITIONS AND TERMINOLOGY

This invention is concerned with fused quartz and quartz glass containing a high percentage of silica as can be produced from quartz sand or from synthetic quartz of even higher purity. Quartz glasses commonly contain 99 to 99.95 percent by weight or more of silica and rarely contain more than 2 percent by weight of other compounds. The term "quartz", as applied to glass, excludes borosilicate glasses, such as Vycor, containing 96 percent by weight of silica.

The term "refractory" as applied to a glass indicates the ability of a glass to withstand metal casting temperatures as high as 1500° C. as are encountered in the casting of iron. A "quartz refractory composition" is one which is capable of producing a refractory fused quartz product.

The term "high-purity" as applied to modern fused quartz indicates a purity of at least 99.95 to 99.99 percent by weight. Ultra-pure synthetic quartz glass can have a purity of 99.999 percent.

The dictionary term "micronized" is used herein with respect to particles which have been ground or pulverized to provide a particle size not substantially in excess of 10 microns as is preferred for slip casting.

The term "water-insoluble" is used in a normal sense with respect to compounds which are not readily soluble in water.

Micronized particles of a crystallization aid, such as aluminum hydroxide, are not "dispersible" if they agglomerate and do not provide a suitable suspension of dispersed micronized particles. The term "stable suspension" as used herein with respect to a slurry or slip indicates a suspension of dispersed micronized or micron-size particles with adequate stability for conventional slip casting at a suitable pH, such as 7 to 8.

The term "shock-resistant" as applied to a glass refers to the excellent thermal shock resistance characteristic of all-vitreous high-purity silica and quartz glass.

The term "beta OH value" is used in its normal sense to indicate the hydroxyl content of a quartz glass as measured by infrared spectroscopy. This term is further defined in U.S. Pat. Nos. 4,072,489 and 4,772,305.

An aluminum-oxide precursor used as a crystallization aid in a quartz refractory composition according to this invention provides the quartz glass with a small amount of added aluminum oxide usually less than 0.1 percent by weight. The term "added" indicates that such amount is in addition to the aluminum oxide impurities from the original fused quartz particles of said composition.

The term "viscosity" as used in connection with cristobalite-containing quartz glass refers to the apparent or measured viscosity determined from conventional viscosity measurements.

It will be understood that, unless the context suggests otherwise, parts and percentages are by weight rather than by volume.

DESCRIPTION OF PREFERRED EMBODIMENTS

The present invention relates to high-purity shock-resistant vitreous silica articles that are preferably formed from an aqueous slurry of fine fused quartz particles by slip casting or electrophoretic deposition, A shaped or molded preform is dried and fired to provide a porous silica body with a porosity of 10 to 25 volume percent which is subsequently fired or sintered to coalesce the silica particles and to form a high-density quartz glass with a modulus of rupture at 25° C. of at least 800 and preferably at least 1000 kilograms of force per square centimeter. When slip casting is employed, the quartz refractory composition used in the slurry preferably contains fused quartz particles with an average particle size no greater than 10 microns.

The process of the present invention is characterized by the use of an added crystallization aid that provides metallic ions (e.g., alkali metal or aluminum ions) and starts the growth of cristobalite and by nucleation or seeding of the glass to provide a dense concentration of cristobalite nuclei without forming a substantial amount of cristobalite, thus retaining advantages of vitreous silica and avoiding significant deterioration due to the crystallographic alpha-beta inversion each time the glass is heated to or cooled from a high temperature.

The desired nucleation can be effected by heating the silica article to a temperature of from 1200° to about 1250° C. for 1 to 3 hours or more when the article is porous or has internal voids or pores or when it is otherwise provided with internal nucleation sites. As pointed out hereinafter, the seeding or nucleation treatment can be provided before, during or after the porous silica preform is fired or sintered to a high density.

Nucleated quartz glass products made in accordance with the invention, when heated from a temperature below 100° C. to high temperatures, such as 1400° C. or above, will devitrify and form substantial amounts of cristobalite in a short or reasonably short period of time dependent on the amount and type of crystallization aid present in the glass and on the concentration of the cristobalite nuclei (or average distance between adjacent nuclei). The concentration of cristobalite nuclei provided in the glass depends on the intended use and is usually such that heating of the glass for one hour at 1450° C. will convert at least 20 percent of the vitreous silica to cristobalite.

A higher concentration can be provided in a glass crucible for a Cz crystal-growing furnace so that it is possible to convert 70 to 90 percent of the silica to cristobalite within a relatively short period of time, such as 2 to 4 hours, by heating the glass to a temperature of 1400° to 1450° C., even when the amount of the crystallization aid is relatively low (e.g., from 0.01 to 0.02 percent by weight).

When making slip-cast Cz crucibles, before sintering the porous preform to high density, the preform is preferably heated to a temperature above 1100° C. for at least 1 or 2 hours under high vacuum in a conventional vacuum furnace to minimize the hydroxyl content of the glass (See U.S. Pat. No. 4,072,489), and to provide a low beta OH value, such as 0.02 to 0.04. The hydroxyl content is preferably reduced to 0.005 percent or less.

In carrying out one embodiment of the present invention, best results are obtained by adding to the quartz refractory composition a crystallization aid comprising an aluminum compound or aluminum-oxide precursor which provides the quartz glass product with an effective amount (i.e., at least about 0.005 percent) of added aluminum oxide ($Al_2O_3$). The "aluminum compound" used as a crystallization aid in the practice of the invention may, be an aluminum salt, aluminum nitride, a silicon-aluminum oxynitride, an alumino-silicate, or other suitable aluminum-oxide precursor. The aluminum compound selected for use in slip casting is water-insoluble and dispersible or capable of remaining in suspension for a reasonable period of time. Micronized particles of basic aluminum acetate appear to provide optimum results and can be effective in very small amounts providing the quartz glass with only 0.005 to 0.01 percent by weight of aluminum ions.

Good results can be obtained when the basic aluminum acetate particles are replaced by micronized dispersible particles of another crystallization aid, preferably a refractory metal silicate, such as aluminum silicate or zirconium silicate, which can be pulverized or ground to the desired size.

Other options can provide satisfactory results. Micronized dispersible refractory particles of a specially-designed silica-metal or silica-aluminum compound could be incorporated in the quartz refractory composition of the aqueous slurry. The particles of such compound could have an average particle size of from 1 to 5 microns and consist of 75 to 90 percent by weight of vitreous silica, 10 to 20 percent or more of aluminum oxide, and optionally 10 to 20 percent of cristobalite. For example, the particles of the silica-aluminum compound could be ground in a ball mill to provide an average particle size of from 3 to 8 microns and could consist essentially of from about 80 to 90 percent by weight of silica and from about 10 to 20 percent by weight of aluminum oxide.

When a shaped quartz glass article is made by slip casting in accordance with this invention, it is important to form the slip or slurry from micronized particles that are readily dispersible and do not cause intolerable agglomeration problems. The crystallization aid preferably provides a relatively stable suspension of dispersed micronized particles so that the distribution of the seeding particles is homogeneous rather than haphazard.

When the micronized seeding particles are formed from alpha quartz or a refractory metal compound, such a zirconium silicate, they can be ground in a ball mill or pulverized to a small particle size (i.e., an average particle size of from 1 to 6 microns or less). The refractory metal compound selected for use in the practice of this invention should be capable of providing diffuse cristobalite nucleation sites in the glass. An aluminum-oxide precursor, such as an alumino-silicate, can be suitable for this purpose.

Other silicon-oxygen-metal compounds, such as zirconium silicate, can be used which function in a somewhat different manner to initiate the formation of the desired cristobalite nuclei at the aforesaid nucleation sites when heated to a sufficiently high temperature. If the seeding particles are formed of zirconium silicate or alpha quartz, they can be heated to a high temperature above 1500° C. to provide the desired cristobalite nuclei. It is believed that the silicate will decompose as it is heated from 1500° C. to 1600° C. so as to form both zirconium oxide and cristobalite. It is thus possible to form diffuse cristobalite nuclei during sintering of the slip-cast silica preform in the induction furnace (as previously described). The furnace can, of course, be controlled so that the maximum glass temperature during sintering is below 1720° C. and below the melting point of cristobalite and so that the cristobalite nuclei are retained.

A quartz refractory composition prepared in accordance with one embodiment of this invention generally consists essentially of milled particles of fused quartz (e.g., at least 99.9 percent silica) with an average particle size from 1 to 8 microns and a minute amount by weight of micronized dispersible (non-colloidal) particles of a special crystallization aid having an average particle size of from 1 to 8 microns and providing the final glass product with from 0.004 to 0.03 percent by weight of added metal ions (e.g., aluminum ions).

A quartz refractory composition suitable for making crucibles or receptacles may, for example, comprise essentially micronized fused quartz particles with an average particle size of from 2 to 8 microns mixed in a slurry with micronized dispersible particles of an aluminum compound with an average particle size of from 1 to 6 microns.

In the manufacture of quartz glass crucibles for use in Cz crystal-growing furnaces, uniformity and reliability is important. Best results are obtained when the particle-size ranges are controlled. For example, the quartz refractory composition used for making Cz crucibles provides excellent results when the ball-milled fused quartz particles have an average particle size of from 2 to 8 microns and at least 75 percent by weight of the aluminum subacetate particles or other seeding particles have a particle size of from 3 to 6 microns.

The use of an aluminum compound is an important feature of the invention in connection with the manufacture of quartz glass crucibles for use in Cz crystal growing because of the special problems associated with such use. The aluminum oxide precursor provides remarkable results and makes it possible to overcome the slow kinetics normally associated with the nucleation and growth of cristobalite while at the same time providing a degree of reliability and predictability in the crystallization process which heretofore appeared to be unattainable.

When making high-purity silica glass crucibles or receptacles according to this invention, the amount of added aluminum oxide provided by the aluminum crystallization aid (e.g., aluminum subacetate) is preferably no more than 0.1 percent and the total amount of all other impurities in the glass is no more than 0.1 percent and preferably less than 0.02 percent.

The maximum amount of added aluminum oxide employed in the quartz refractory composition is preferably less than 0.2 percent by weight and depends, of course, on the type of glass product being made. The amount used for Cz quartz glass crucibles is from about 0.007 to about 0.1 percent and for D.S. glass cores is from about 0.01 to about 0.2 percent.

Although the crucible may contain less aluminum oxide than the core, the rate of increase in the cristobalite content of the glass may be higher for the crucible when it is heated to 1400° C. or higher because of the higher concentration of cristobalite nuclei per unit volume as provided by the nucleation heat treatment.

The degree of nucleation in the glass core and the amount of aluminum oxide may be such that heating of the core for one hour at a temperature of 1450° C. will increase the cristobalite content above 10 percent and provide the article with a viscosity at 1500° C. of at least 2 to 4 times $10^{12}$ poise.

The glass crucibles of this invention may contain an amount of added aluminum oxide of from 0.01 to 0.02 percent or more and a dense concentration of cristobalite nuclei such that a major portion, at least 70 percent by weight, of the crucible is converted to beta cristobalite in a time period of 3 to 4 hours or less when the entire crucible is maintained at a temperature of 1400° C.

Such a high rate of crystallization is not required in drawn glass cores. In order to provide a silica glass with oriented striations and adequate internal surface area for proper cristobalite growth in a core, the porous sintered silica preform is preferably extended or drawn to reduce the cross-sectional area at least 95 percent.

When making glass cores for D.S. casting, the glass can be drawn in a conventional glass redraw machine such as shown and described in U.S. Pat. No. 3,652,248. That machine is shown schematically and described in Loxley et al patent application Ser. No. 523,982. In a typical drawing operation, the porous silica preform has an outside diameter of from 15 to 20 millimeters and is drawn to form a glass rod or tube with an outside diameter or width of from about 1 to 2 millimeters and a density of at least 98 percent.

Quartz glass crucibles can be mass-produced in an economical manner in accordance with the present invention using conventional slip casting with fused quartz and the equipment of the type described in U.S. Pat. Nos. 3,837,825 and 4,072,489 and following sintering procedures similar to those described in those patents.

The fused quartz of the slip is preferably a high-purity vitreous silica containing an amount of aluminum oxide below 100 ppm (parts per million) and amounts of sodium, potassium, calcium, magnesium and iron oxides which total from 10 to 50 ppm. The vitreous silica used in making the Cz crucibles can be essentially free of crystalline silica and preferably contains less than one percent by weight of cristobalite.

After the slip-cast crucible is dried and fired, it is preferably subjected to vacuum drying prior to the final sintering operation. The furnace temperature at the end of the sintering operation may be as high as 1750° C., but most of the sintering is carried out at a lower temperature in the range of from 1500° to 1700° C.

In accordance with the invention, the silica glass is seeded with cristobalite nuclei by a nucleation heat treatment which forms such nuclei on nucleation sites provided by the added aluminum ions The nucleation may, for instance, be initiated prior to sintering by heating the dried porous slip-cast crucible either during or after the vacuum drying operation. The nucleation may also be provided during sintering or after the crucible is sintered and delivered to the crystal grower.

The nucleation heat treatment is designed to provide the glass article with a high concentration of dispersed cristobalite nuclei per unit volume and to limit the amount of cristobalite formed during manufacture. The glass crucible leaving the factory usually contains less than one percent by weight of crystalline silica so that it has good thermal shock properties and good flexural strength.

In making glass cores and crucibles according to this invention, it is necessary to form high-density silica glass which has the required nucleation sites and which favors the nucleation and growth of cristobalite. A seeded or nucleated glass is provided which will crystallize at an adequate rate to develop the desired properties in a reasonable period of time when the glass is heated during use.

For example, the striated structure resulting from drawing a porous silica preform according to the invention makes it possible, with a silica glass containing aluminum oxide, to nucleate the drawn glass and to obtain a viscosity of at least 2 to 4 times $10^{12}$ poise at 1500° C. before the end of a 20 to 30-minute preheat in the D.S. casting process.

In the case of glass crucibles used in Cz crystal-growing furnaces, the present invention provides a homogeneous seeded structure with a high concentration of cristobalite nuclei so that it becomes possible in some crucibles to convert at least 70 percent by weight of the silica to cristobalite or crystalline silica in 2 to 4 hours or less at 1400° C.

In making high-density glass articles according to this invention, different methods may be employed to effect the desired nucleation without forming an excessive amount of cristobalite. A combination of these methods may also be appropriate. One method involves heating the dried slip-cast crucible, which has a porosity of 10 to 15 percent or more, for a time period of at least several hours at a temperature, such as 1200° to 1250° C., adequate to form a high concentration of cristobalite nuclei. If desired, this can be done during vacuum drying, but it is preferable to reduce the hydroxyl content to a low value before nucleating substantial amounts of cristobalite.

One way to make a nucleated silica glass according to the invention is to provide a multiplicity of internal pores and to provide a crystallization aid, such as an aluminum compound, as previously described. The aluminum ions from the crystallization aid provide the nucleation sites. In this method, the crucible or receptacle is sintered in an atmosphere of argon or other inert gas, for example, to provide a porosity of from 0.2 to 2 volume percent or higher.

When the above method is employed to provide the glass with internal pores, the furnace temperature can be as high as 750° C. near the end of the sintering operation to melt out or destroy most or all of the cristobalite.

In carrying out the process of this invention, nucleation is initiated by heating the silica to a temperature of 1200° to 1250° C. or higher. When making glass cores using a glass-drawing apparatus, such as that of U.S. Pat. No. 3,652,248, a heat treatment is provided after the glass is drawn to its final thickness. When making glass crucibles, the nucleation may be effected before, during or after the final sintering of the glass.

The heat treatment for silica glass cores can be carried out at a temperature of from 1200° to 1350° C. for 1 to 10 hours or more to provide the desired cristobalite content, which may be from 1 to 4 percent by weight.

In making cores for D.S. casting, for example, the heat treatment can be for 2 to 5 hours or so at a temperature from 1200° to 1250° C. to provide a cristobalite content of at least one percent by weight and a viscosity at 1450° C. of from 1.5 to 5 times $10^{12}$ poise.

The preferred cristobalite content depends on the size of the core and strength requirements. It may be critical or important in D.S. cores with a diameter of 1 to 3 millimeters or less. However, the process of this invention can be employed to produce quartz glass rods, tubes and filaments with cristobalite contents of 10 percent by weight or more and viscosities of $10^{13}$ to $10^{14}$ poise or higher at 1500° C. where flexural strength is less important.

Drawn silica glass tubes made in accordance with this invention are well suited for use in conventional cores of the type shown in the aforesaid application Ser. No. 523,982 designed for D.S. monocrystal casting at temperatures above 1450° C. A core of this type has excellent sag resistance and functions well in the conventional D.S. casting process with glass tubes having diameters of from 1 to 2 millimeters or less, even when the metal pouring temperature is in the range of 1500° to 1550° C.

The process of this invention makes it possible to manufacture commercial quartz glass cores admirably suited for use in conventional D.S. monocrystal casting processes. It facilitates economical commercial production of drawn glass rods and tubes with a viscosity at 1450° C. in the range of from $10^{12}$ to $10^{13}$ poise and with good flexural strength (e.g., a modulus of rupture at 25° C. of at least 1000 kilograms per square centimeter).

The process of this invention is also well suited to mass production of quartz glass receptacles and a variety of other refractory glass products. The procedures previously described can be used to make a tapered crucible as shown in FIG. 9 of said application Ser. No. 523,982 or crucible of more common shape as used in commercial Cz crystal-growing furnaces. The unique cristobalite crucibles of the present invention help to solve serious melt contamination problems associated with amorphous silica crucibles, such as arc-fused crucibles.

The conventional amorphous silica crucibles used in Cz furnaces are advantageous in that they are not damaged during the initial melt down. However, the vitreous silica is attacked by the molten silicon so that excessive amounts of oxygen and other contaminants are introduced from the glass to the melt.

The contamination problem becomes even more serious as the smooth interior surface of the crucible deteriorates and becomes rough and uneven. For this reason, the conventional vitreous silica crucible is not suitable for reuse after the Cz crystal-growing operation is completed. The unique cristobalite crucible of this invention functions in a different manner because the inner surface can resist attack by the molten silicon. The cristobalite crucible can sometimes be reused 2 to 4 times or more before it is discarded.

The quartz glass crucibles used for Cz crystal growing can be very expensive. A substantial amount of the cost is due to the need for ultra-pure silica. Fused silica with a purity of 99.99 percent suitable for Cz crucible manufacture is expensive. On the other hand, treated quartz sand of comparable purity is much less expensive. The present invention makes possible a great reduction in the cost of manufacture of crucibles, receptacles and other quartz glass products because it permits replacement of 25 to 75 percent by weight of the fused quartz with ultra-pure crystalline quartz.

In the embodiment of the invention previously described in which the slurry (used for slip-casting, gel-casting or electrophoretic deposition) contains micronized dispersible particles of an aluminum compound, such as basic aluminum acetate, the quartz glass is usually heated to a temperature above 1700° C. and above the melting point of cristobalite. In such a process the alpha quartz particles (i.e., quartz sand) of the refractory composition are melted and becomes quartz glass (i.e., vitreous silica).

For example, in the manufacture of ultra-pure quartz glass products in accordance with this invention, the silica particles of the refractory composition can be wet milled in a ball mill to an average particle size of from 2 to 10 microns and can consist of 30 percent by weight of high-purity fused quartz particles and 70 percent by weight of high-purity alpha quartz particles. The crystalline quartz would be milled separately and then mixed with the micronized fused quartz particles and the micronized particles of the aluminum compound. The slip-casting procedure and subsequent sintering operations would be essentially the same as when using fused silica particles only. The final heating would preferably be to a temperature of about 1750° C. to melt all of the crystalline silica and to form a full-density or transparent vitreous product essentially free of cristobalite.

Substantial savings are achieved when part or almost all of the fused quartz in the refractory composition is replaced by alpha quartz. It is much easier to remove impurities from quartz sand than to produce high-purity fused quartz. A large amount of electrical energy is required to produce fused quartz. The savings in electrical energy that can be achieved by use of alpha quartz in the refractory compositions of this invention are significant and perhaps as much as 3 kilowatt hours per pound.

The embodiment just described can produce excellent Cz quartz glass crucibles and can produce transparent bubble-free quartz glass TEOS as a sintering aid a. However, the quartz glass made in this manner contains aluminum ions. The Cz crystal grower may prefer to use a cristobalite crucible with a higher purity.

A second preferred embodiment of the invention makes it possible to avoid the introduction of aluminum ions or other metallic ions to promote cristobalite growth. In this embodiment the micronized dispersible particles of the aluminum-oxide precursor are replaced by micronized particles of alpha quartz or alpha cristobalite having a high purity preferably greater than 99.99 percent by weight. These particles provide uniformly distributed nucleation sites or cristobalite nuclei in the glass, and it is necessary to limit the furnace temperature during the final heating and to avoid melting the cristobalite. The final furnace temperature can be from 1600° C. to 1700° C. and should be below 1720° C.

The use of micron-size particles of high-purity crystalline silica to provide nucleation sites in the glass is disclosed in our copending application Ser. No. 523,982. That application discloses use of a quartz refractory composition consisting of fine particles of fused quartz and from 1 to 4 percent by weight of alpha cristobalite having an average particle size of from 0.1 to 5 microns. These cristobalite particles in the slurry used for slip casting provide a slip-cast crucible or other quartz glass product with a high concentration of nucleation sites uniformly distributed throughout the glass. It is preferable to employ high-purity alpha quartz particles (i.e., treated sand) rather than cristobalite particles. The alpha quartz is melted and converted to cristobalite in the typical sintering operation at a temperature from 1600° to 1680° C. The cristobalite nuclei formed in this way appear to function better than those provided by alpha cristobalite particles. Good results can be obtained using from about 0.5 to about 3 percent by weight of high-purity alpha quartz in the refractory composition, and it is possible to produce transparent quartz glass products, such as Cz crucibles, having a purity exceeding 99.99 percent.

The unique seeded quartz glass of the present invention has a number of uses which are potentially important in addition to those previously described. Special quartz glass seeded with a high concentration of evenly distributed cristobalite nuclei according to the invention can be used in the manufacture or fabrication of a variety of refractory products. For example, such seeded quartz glass can be broken into pieces to form cullet and thereafter ground or pulverized to form refractory particles with a particle size of from 30 to 100 microns or more and used to make porous refractory ceramic cores or mold parts for metal casting. The ceramic cores or molds can be formed by conventional molding methods including injection molding (See U.S. Pat. No. 3,222,435).

In accordance with the present invention, such particles of the special seeded quartz glass with a particle size of from 30 to 100 microns can be used, for example, in the manufacture of porous ceramic cores of the type disclosed in U.S. Pat. Nos. 4,093,017 and 4,236,568. Each of these patents discloses a core composition comprising refractory particles, an organic binder, and a mineralizer or crystallization aid (preferably a sodium-stabilized colloidal silica, such as Ludox) which provides devitrifying sodium ions to promote the growth of cristobalite. The refractory particles of said core composition can include small amounts of another refractory, such as zircon or zirconia, but preferably comprise at least 90 percent by weight of vitreous silica. According to these patents, a major portion by weight of the refractory particles are of substantial size (i.e., from 35 to 100 microns or greater) and a minor portion are of smaller size.

The larger particles of the core compositions of these two patents can be formed of the special seeded quartz glass of the present invention. A porous ceramic core made from such a unique composition and molded and fired according to said patents can have important advantages over conventional ceramic cores made without the special seeded quartz glass particles. With the same amount of mineralizer (i.e., Ludox), it is possible to convert more of the silica to cristobalite before metal casting. It also becomes possible to obtain adequate reinforcement from cristobalite when reducing or minimizing the amount of the mineralizer or when using a different crystallization aid, thereby reducing the problems normally associated with alkali metal ions and improving the refractory properties of the ceramic material.

Quartz glass seeded with cristobalite nuclei in accordance with this invention has other important uses. Drawn quartz glass fibers with outstanding high-temperature properties made according to the invention can be used in the fabrication of various products as disclosed in said application Ser. No. 523,982.

Processes, products and procedures are described herein for producing quartz glass products, such as crucibles or receptacles, which can be produced from a slurry by slip casting or electrophoretic deposition. The quality of such products can be significantly improved by employing unique procedures involving use of hydrolyzed organo-silicates as described in the patent application of Ted A. Loxley, not yet filed. That application relates to a unique gel-casting process and to a process for producing transparent bubble-free quartz glass of optical quality using tetraethylorthosilicate (TEOS) or a comparable silicon-containing organic compound, such as tetramethylorthosilicate (TMOS) or methyltrimethyloxysilane.

Said organic compound, which is disclosed in some detail in U.S. Pat. No. 4,789,389, has the formula Si(OR)$_4$ or SiR(OR)$_3$ where R is an alkyl group. An aqueous solution of this compound is hydrolyzed using an acid, such as hydrochloric acid, to promote hydrolysis. Partially hydrolyzed TEOS is available commercially and can sometimes be used in the practice of the invention.

The process of the aforesaid Loxley application is particularly useful in the manufacture of transparent bubble-free glass of very high quality as required for optical-grade glass or Cz crucibles. For example, cristobalite-nucleated vitreous quartz glass receptacles or crucibles made from a slurry, as by slip casting or electrophoretic deposition, in accordance with the present invention are greatly improved when the porous silica body (preform) is completely impregnated with a silica sol or hydrolyzed TEOS prior to sintering of the glass to full density. A commercially available hydrolyzed TEOS is suitable for this purpose.

The hydrolyzed TEOS fills the pores of the preform and functions to eliminate gas bubbles in the glass resulting from large pores in the preform and to facilitate the escape of gas from the preform during sintering. It also serves as a sintering aid and permits sintering of the silica at lower temperatures. Optionally the TEOS in the pores of the silica preform can be gelled in an atmosphere of ammonia at room temperature, thereby assuring uniformity in the sintered product.

Impregnation of the pores of the porous silica preform with hydrolyzed TEOS serves another purpose. For some reason, perhaps due to the formation of silicon monoxide gas, the TEOS facilitates the removal of alkali metal ions. Near the outer surface of the glass product the percentage of alkali metal ions can be reduced substantially, sometimes more than 50 percent.

In the manufacture of a slip-cast quartz glass receptacle, such as a crucible, the preferred procedure is to impregnate the entire silica preform with hydrolyzed TEOS, gel the solution in ammonia, dry the preform, sinter the preform in a vacuum furnace at a temperature of from 1200° to 1400° C. to a high density, and thereafter heat the densified preform in a vacuum furnace or in a helium atmosphere to provide a transparent bubble-free quartz glass. This process facilitates commercial production of cristobalite-nucleated Cz crucibles having the quality and reliability demanded by crystal growers.

Some of the advantages of TEOS impregnation as described above can be obtained when the porous silica preform is impregnated with a different silica sol, such as a hydrolyzed silicon tetrachloride, but the acid associated with Si Cl$_4$ could be troublesome.

The aforesaid Loxley application also discloses a unique process for gel casting which has great potential in the industry and makes it commercially practical to produce high-quality silica products which could not be made by slip casting. The process involves the addition of TEOS or other suitable organo-silicate to an aqueous slurry having a high silica content, such as 80 to 85 percent and hydrolyzing the TEOS in situ during subsequent mixing. A gelling agent or catalyst, such as morpholine or other weak base, is added to the hydrolyzed slurry just before casting to speed up gelling or polymerization of the silica in the solution.

For example, in the practice of the present invention, an aqueous slurry is prepared in a ball mill having a solids content of about 82 percent and a pH of about 2 to 4 and containing fused quartz particles with an average particle size of from 6 to 8 microns. A minute amount of micronized particles of basic aluminum acetate are thoroughly dispersed in the slurry and TEOS is then mixed with the slurry along with a small amount of hydrochloric acid to promote hydrolysis and ethanol to improve miscibility. No additional water is added to the slurry. The liquid in the original slurry provides the water for hydrolysis of the TEOS and may be somewhat below or somewhat in excess of the stoichiometrically required amount.

The product produced by this unique gel-casting method has remarkably good quality and does not suffer from the serious cracking and shrinkage problems associated with prior gel-casting processes, probably because the water responsible for the shrinkage problem has been minimized in amount. This unique method is particularly well suited to commercial manufacture of ultra-pure silica glass products and products that cannot be made by conventional slip casting.

There are set forth hereinafter suppositive instances of recommended methods and procedures to illustrate and make clear the rudiments and important features of the invention. The specific disclosures herein are to some extent rudimentary, and changes or improvements in the procedures advocated or suggested are to be expected. In some instances it may be desirable to sinter the glass to a high density in a vacuum rather than in a helium atmosphere or to form the glass receptacle or crucible by electrophoretic deposition or pressure slip casting instead of the more common drain casting. Some changes in the methods or procedures may be found satisfactory or desirable when making a particular product or when using a particular crystallization aid.

In some cases special procedures may be desirable to reduce flocculation of the silica particles and/or to improve the diffusion or dispersion of the micronized particles in the slurry. After the addition of the micronized dispersible particles of the crystallization aid to the slurry, the mixing could be continued for more than 10 hours with agitation before the slurry is used for slip casting. It may be best to carry out such extended mixing in the ball mill.

The compositions, methods and procedures advocated in the illustrative examples which follow are practicable, but they do not necessarily correspond to those best suited for commercial practice of the invention or those which will actually be adopted. There are a number of ways to practice the invention. They may, of course, be influenced or dictated by the real or supposed needs of the customer (e.g., the Cz crystal grower), the choice of the crystallization aid, or other factors. This is particularly true with respect to the nucleation heat treatment provided for the crucible or receptacle.

For example, a nucleation treatment of the type described previously or in Example I which follows is normally appropriate before the quartz glass crucible is used-in the Cz crystal-growing process and can be provided by the crucible manufacturer before the crucible is shipped out of the factory. However, better results can probably be obtained if the full-density transparent crucibles seeded in accordance with the invention are shipped from the factory to the Cz crystal grower without such heat treatment or with a more moderate heat treatment that minimizes the deterioration of the glass during the alpha-beta inversion.

A crucible manufacturer may prefer to provide a moderate nucleation heat treatment at the factory, thereby permitting inspection of the nucleated crucibles and adequate quality control. Nucleation of the glass at the factory may become necessary or important because of the nature of the crystallization aid being used (e.g., when using zirconium silicate).

From the viewpoint of a Cz crystal grower, it is essential that cracking or catastrophic failure of the crucible be avoided during growing of the silicon monocrystal. Because of concerns regarding possible damage to the crucible when it is cooled and heated through the alpha-beta inversion, the crystal grower may insist that the seeded crucible of this invention be transparent and also substantially free of cristobalite. Best results would be obtained if the crucible were heated above 1200° C. to develop the cristobalite nuclei and thereafter maintained at a high temperature to avoid the alpha-beta inversion completely.

In the preferred process, the crystal grower places chunks of silicon in the crucible at room temperature and then nucleates the crucible by heating it with the silicon for at least several hours in a furnace maintained at a temperature of from about 1200° to about 1250° C., thereby developing cristobalite nuclei at the evenly dispersed nucleation sites. The crucible and the (optional) chunks of silicon would be maintained at a high temperature, preferably above 1000° C., placed in the Cz crystal-growing furnace, and then heated to a temperature of at least about 1400° C. to convert a major portion by weight, preferably 70 to 90 percent or more, of the vitreous silica to cristobalite before crystal growing is initiated.

The methods and procedures described and the unique refractory compositions advocated in the examples of this specification or set forth as preferred embodiments are merely illustrative and are not intended to limit the scope of the invention. They are practicable and should be appropriate and useful in attaining the major or important advantages of the invention.

EXAMPLE I

A high-purity fused quartz slurry is prepared by wet milling high-purity fused quartz (99.99% $SiO_2$) using deionized water and a high-purity fused quartz grinding media in a conventional ball mill. After the silica particles are milled for more than 16 hours to the desired particle size, the pH of the slurry is less than 4 and is adjusted to about 7.5 by adding some dilute ammonium hydroxide. The average particle size of the fused quartz particles in the slurry used in this Example is from 6 to 7 microns.

A small amount of a crystallization aid consisting of essentially-pure micronized particles of basic aluminum acetate (i.e., aluminum subacetate) having an average particle size of from 4 to 6 microns is then added to the slurry. The aqueous slurry containing the micronized particles of vitreous silica mixed with micronized particles of aluminum subacetate and having a pH of around 7.5 is located in a motor-driven rotary mixer and mixed for at least 12 hours with moderate agitation to thoroughly and homogeneously disperse the aluminum subacetate particles. During the mixing the rotating blades of the mixer have a rotational speed adequate to break up the floccules of vitreous silica that are formed when the ammonium hydroxide is added to the slurry, whereby the water-insoluble subacetate particles can be uniformly dispersed in stable aqueous suspension. The basic aluminum acetate functions in a unique manner because of the surprising and incomparable ability of the micronized particles to remain in suspension for extended periods of time.

The amount of the crystallization aid may be very small and such as to provide the sintered glass crucible with around 0.015 per cent by weight of added aluminum ions. In this Example I the amount is from about 7.0 to 7.5 grams of basic aluminum acetate for every 10 kilograms of slurry to provide the desired concentration of aluminum ions in the glass. The homogenized aqueous slurry normally has a solids content of about 82 percent by weight.

A slurry prepared in the manner described above for use in this Example I can also be used in the examples which follow to make the desired quartz glass article.

The homogenized slurry prepared above is used for slip casting a quartz glass crucible using conventional procedures generally as described in U.S. Pat. Nos. 3,972,704 and 4,072,489. The crucible has a diameter of about 20 to 22 centimeters, an axial height of about 18 to 20 centimeters, and a wall thickness of from about 4.6 to 5 millimeters and is shaped to fit the heated graphite mandrel or susceptor (16) of the semi-automatic induction furnace apparatus described in said patents.

A conventional plaster of Paris mold may be employed for slip casting the crucible. The homogenized slurry is used to fill the mold and form the slip-cast piece. The excess slurry is removed, and the cast piece is dried briefly at room temperature, separated from the mold and then dried for 20 hours or more at a temperature above 40° C. to remove the free water.

The resulting porous silica body (i.e., crucible preform) is then placed in a vacuum furnace and fired at a temperature of from about 1170° to about 1180° C. for 3 hours or so to provide the porous body with adequate strength for handling and to reduce the hydroxyl content of the glass to less than 0.005 percent by weight. The subatmospheric pressure in the vacuum furnace is preferably less than 10 torrs. The fired silica body has a substantial porosity (i.e., from about 15 to 20 percent by volume) which facilitates the water removal.

Thereafter, the porous silica body at a temperature below 100° C. i.e., room temperature, is mounted upside down on the heated graphite mandrel (16) of a semi-automatic furnace as disclosed in said U.S. Pat. No. 4,072,489. The silica body is heated and sintered for at least about 10 minutes in a helium atmosphere in the induction furnace to a temperature of at least 1700° C to coalesce the silica particles and to produce a full-density transparent quartz glass crucible. The sintering is preferably carried out generally in the manner described in said U.S. Pat. No. 4,072,489 until the glass temperature leaches 1750° C. so that the quartz glass is transparent and substantially free of cristobalite. The graphite mandrel (16) on which the crucible is mounted is then retracted out of the furnace heating chamber, and the crucible is removed from the mandrel and allowed to cool to room temperature.

A sintered transparent quartz glass crucible made according to this Example I may be provided with a nucleation heat treatment before being used in a Cz process for growing silicon monocrystal. For example, the crucible is placed in a furnace and heated for about 4 to 5 hours at a temperature of around 1250° C. to form a high concentration of cristobalite nuclei at the nucleation sites provided by the uniformly dispersed aluminum ions without forming a substantial or excessive amount of cristobalite. The nucleated crucible can then be cooled below 100° C. to room temperature and later heated to a temperature above 1400° C. in a conventional Cz crystal-growing furnace to convert most of the vitreous silica to cristobalite in a relatively short period of time, such as 2 hours or less.

Best results would, of course, be obtained by providing such a nucleation heat treatment at 1250° C. for several hours in a Cz crystal-growing furnace and then increasing the temperature above 1400° C. to melt chunks of silicon metal in the crucible and to cause crystallization of the glass without first cooling the crucible through the deteriorating alpha-beta inversion.

In commercial practice the sintered transparent quartz glass crucibles containing at least 99.98 percent by weight of silica could be shipped from the crucible manufacturer to the crystal grower with or without the nucleation heat treatment. Either way it is practicable to convert the crucible to cristobalite before the crystal growing, thereby reducing or minimizing melt containation problems and producing silicon monocrystal of higher quality than can be produced with conventional quartz glass crucibles.

It will be understood that the crucible can be slip cast in a porous silica mold, rather than in a conventional plaster mold, to avoid calcium contamination and/or to permit use of a somewhat lower pH in the slurry, and that the particle size of the micronized particles in the slurry and the amount of the aluminum subacetate may be modified. It should be possible, in this Example I, to obtain benefits of the invention when the amount of the subacetate crystallization aid (for each 10 kilograms of slurry) is changed from about 7.5 grams to about 5.5 grams or about 9 grams, for example.

It is also possible to obtain admirable results using the compositions, methods and procedures of this Example when making crucibles of greater size (e.g., a diameter of 12 to 16 inches) and of equal or somewhat greater wall thickness suitable for use in modern Cz furnaces. The sintering time in the helium atmosphere of the induction furnace may be 1 or 2 minutes longer for the larger crucible to allow the glass to reach a temperature of 1750° C. Such time would likely be from 10 to 12 minutes for a 12-inch diameter crucible of conventional shape.

EXAMPLE II

A slurry is prepared and used for slip casting of a crucible as in Example I, and the porous preform is fired in the vacuum furnace in the manner described. The resulting vacuum-dried porous crucible of Example I is then sintered at atmospheric pressure in the same semi-automatic induction furnace but in an atmosphere of argon rather than helium. The sintering procedure is essentially the same as in Example I but the sintered crucible is not transparent and has a significant porosity, such as from 1 to 2 volume percent. The internal pores containing aluminum ions apparently provide good sites for nucleation of cristobalite. A crucible made according to this Example II is well suited for use in a Cz crystal-growing furnace.

EXAMPLE III

A slurry prepared using the composition, method and procedure described in Example I may be used in the manufacture of drawn quartz glass cores for use in the investment casting of superalloys.

Such a slurry is cast in a conventional plaster of Paris mold to produce a hollow cylindrical preform with an external diameter of about 1.9 centimeters and an internal diameter of about 0.6 centimeter. The slip-cast tubular preform is then dried and fired at a temperature of about 1180° C. for about 3 hours.

The fired porous silica preform is then placed in a glass redraw machine of the type disclosed in U.S. Pat. No. 3,652,248 and is heated by an oxyhydrogen flame to a suitable drawing temperature, such as 180° to 190° C. High density glass is produced by drawing the fused quartz of the preform into a continuous hollow rod or filament having an external diameter of from about 1.3 to about 2 millimeters. The drawn vitreous silica glass rod is then cut to the desired lengths and used to fabricate a glass core suitable for casting-of turbine engine parts. The cut glass rods are bent, spliced and/or ground to provide a core of the desired configuration. The core may be of the general type shown in U.S. Pat. No. 5,053,359.

The fabricated core is placed in a furnace maintained under a high vacuum and heated for 2 to 4 hours at a temperature of from about 1050° to about 1150° C. to reduce the hydroxyl content of the glass to less than 0.005 percent by weight. The fabricated core is subsequently heat treated for 2 to 3 hours at a temperature of from about 1200° to about 1250° C. to cause partial devitrification and to form cristobalite nuclei. The quartz glass of the resulting core has axially oriented veins of cristobalite embedded in a continuous matrix of vitreous silica. After the core is cooled through the alpha-beta inversion and below 100° C. to room temperature, it has good flexural strength and a resistance to deformation at temperatures of 1450° C. and above that is much greater than that of pure vitreous silica.

The commercial use of a process of the type described in the above Example III is practicable and should permit economical and reliable production of drawn quartz glass cores of admirable quality when using a preferred crystallization aid (i.e., aluminum subacetate, aluminum silicate or zirconium silicate). This becomes possible because of the unique homogeneous slurry of micronized dispersible particles which cannot be produced using aluminum hydroxide according to the process disclosed in U.S. Pat. No. 5,053,359.

EXAMPLE IV

A slurry is prepared in a ball mill as in the first paragraph of Example I and a small amount (2 percent by weight) of micronized particles of alpha quartz having a purity of at least 99.99 percent and an average particle size of from 5 to 7 microns is then added to the slurry and thoroughly dispersed therein in a rotary mixer.

The resulting slurry is used for slip casting of a crucible as in Example I and the porous preform is vacuum dried and then sintered in a helium atmosphere in an induction furnace as described in that Example except that the glass temperature does not exceed 1680° C. The resulting crucible has good thermal shock resistance and can be converted to cristobalite in a reasonable period of time when heated to a temperature of 1400° C.

Good results can also be obtained when the alpha quartz particles are replaced by particles of alpha cristobalite.

The crucible of this Example is improved substantially if the vacuum-dried porous silica body (preform) is thoroughly impregnated with hydrolyzed TEOS prior to the final sintering operation. The TEOS serves as a sintering aid and also minimizes the formation of gas bubbles in the glass.

EXAMPLE V

A transparent quartz glass crucible is made according to Example I except that the slurry described in the first paragraph of that example, after milling the fused silica particles to an average particle size of from 6 to 7 microns, is mixed with an aqueous slurry prepared in an identical manner from high-purity alpha quartz, the quartz particles having an average particle size of from 6 to 7 microns. The two separately prepared slurries are thoroughly mixed together in a ball mill for at least 10 hours, the ratio of fused quartz to alpha quartz being about 1:1. The resulting slurry with the pH adjusted to about 7.5 is then mixed with the particles of basic aluminum acetate according to Example 1.

A crucible made according to this Example V is comparable to the crucible made according to Example 1.

It will be understood that the above description is way of illustration rather than limitation and that variations and modifications of the specific compositions, processes and products disclosed herein may be made without departing from the spirit of the invention.

We claim:

1. A process for making a quartz glass comprising shaping a quartz refractory composition containing fine vitreous silica particles to form a porous silica body, heating the silica body to a temperature above 1400° C. to sinter and coalesce the silica particles, the silica body being heated in such manner as to limit crystallization and to provide a vitreous glass, and cooling the resulting refractory glass through the crystallographic alpha-beta inversion to a temperature below 100° C., said process being characterized in that said quartz refractory composition is made by mixing fused quartz particles with an average particle size of from one to ten microns with a minute amount of micronized water-insoluble particles of a crystallization aid having metallic ions that promote the growth of cristobalite to provide a homogeneous mixture; in that said metallic ions provide nucleation sites distributed throughout said silica body; and in that the glass is seeded to provide a high concentration of internal cristobalite nuclei at said nucleation sites.

2. A process according to claim 1 wherein said quartz refractory composition consists essentially of micronized vitreous silica particles having an average particle size of from about one to about eight microns and dispersible particles of a water-insoluble aluminum compound homogeneously distributed in said composition and having an average particle size of from about one to about eight microns.

3. A process according to claim 1 wherein the micronized particles of said crystallization aid are dispersible and thoroughly mixed with the particles of fused quartz to provide a homogeneous slurry suitable for slip casting in which said micronized particles are uniformly dispersed and maintained in suspension.

4. A process according to claim 3 wherein said slurry is caused to enter a porous mold and used to slip cast said porous silica body, said body is dried and fired and thereafter sintered to full density at a temperature of at least 1600° C. to form a transparent quartz glass article.

5. A process according to claim 3 wherein the seeding is effected by heating the vitreous silica at a temperature of at least 1200° C. for a period of at least several hours, thereby forming cristobalite nuclei at the nucleation sites provided by said metallic ions.

6. A process comprising providing a homogeneous slurry containing a quartz refractory composition consisting essentially of micronized particles of silica having an average particle size of from about one to about eight microns and micronized dispersible particles of a water-insoluble crystallization aid that provides metallic ions which promote the growth of cristobalite, said dispersible particles having an average particle size of from about one to about eight microns and providing a stable suspension of dispersed particles, the crystallization aid providing the quartz glass with from about 0.004 to about 0.03 percent by weight of devitrifying metallic ions that form dispersed cristobalite nucleation sites, shaping said composition in a porous slip-casting mold to form a silica body with a porosity of at least 10 volume percent, heating and shaping the porous silica body to coalesce the silica particles and to form a high-density shock-resistant vitreous glass with a modulus of rupture at 25° C. of at least 1000 kilograms per square centimeter, said glass being seeded by heating at a temperature of at least about 1200° C. to form cristobalite nuclei at said nucleation sites, thereafter preheating the glass from a temperature below 100° C. to a temperature of at least 1400° C. to crystallize the glass, and causing molten metal to contact the glass.

7. A process according to claim 1 wherein said crystallization aid is an aluminum compound which provides the glass with from about 0.004 to about 0.03 percent by weight of added aluminum ions; the degree of nucleation in the glass being such that heating of the glass for one hour at a temperature of 1450° C. will convert at least 20 percent by weight of the vitreous silica to cristobalite, 8. A process according to claim 1 wherein said crystallization aid comprises basic aluminum acetate.

9. A process according to claim 1 wherein said refractory composition consists essentially of micronized silica particles with a purity of at least 99.99 percent and micronized dispersible particles of a water-insoluble compound that provides the glass product with a high concentration of evenly dispersed cristobalite nuclei 10. A process according to claim 9, wherein said micronized dispersible particles are formed of crystalline silica.

11. A process for making quartz glass according to claim 1 wherein a slurry is prepared by milling said fused quartz particles for at least 10 hours under acidic conditions and by adding a minute amount of micronized dispersible particles of said crystallization aid that provides the glass with from about 0.004 to about 0.03 percent by weight of added metal ions and wherein mixing is continued with agitation to form a relatively stable suspension.

12. A process according to claim 1 wherein said porous silica body is heated to a temperature sufficient to permit viscous flow and is drawn to form a rod or filament with a diameter not greater than 3 millimeters.

13. A quartz refractory composition consisting essentially of fused quartz particles having an average particle size of from 1 to 10 microns and a small amount of micronized dispersible particles of a water-insoluble metallic compound that promotes the growth of cristobalite, said dispersible particles having an average particle size of from 1 to 8 microns and being homogeneously dispersed in the composition to provide sites for nucleation of cristobalite, said metallic compound being added in an effective amount to provide the quartz glass with from about 0.004 to about 0.03 percent by weight of metallic ions.

14. A according to claim 12 wherein the fused quartz particles have an average particle size of from about 2 to about 8 microns, at least about 75 percent by weight of said micronized dispersible particles having a particle size of from about 3 to about 6 microns.

15. A to claim 13 wherein said metallic compound is basic aluminum acetate.

16. A claim 13 wherein said metallic compound is a refractory metal silicate,

17. A refractory composition according to claim 13 in an aqueous homogeneous slurry suitable for slip casting of quartz glass products wherein said micronized dispersible particles are maintained in suspension and evenly dispersed throughout the slurry to provide the molded quartz glass with a high concentration of cristobalite nucleation sites.

18. A quartz glass product made by shaping a quartz refractory composition containing fine vitreous silica particles to form a porous silica body, heating the silica body to a temperature above 1400° C. to sinter and coalesce the silica particles, the silica body being heated in such manner as to provide a dense vitreous glass, and cooling the resulting glass product to a temperature below 100° C., said refractory composition consisting essentially of micronized particles of fused quartz and a small amount of micronized water-insoluble dispersible particles of a crystallization aid that promotes the growth of cristobalite, said quartz glass product containing a high concentration of evenly dispersed cristobalite nuclei such that heating of the glass for one hour at a temperature of 1450° C will convert at least 20 percent by weight of the glass to beta cristobalite.

19. A according to claim 18 wherein said cristobalite nuclei are formed from micronized particles of crystalline silica having an average particle size of from 1 to 8 microns.

20. A product according to claim 18 formed from a quartz refractory composition consisting essentially of fused quartz with an average particle size of from 1 to 8 microns and micronized dispersible particles of alpha quartz, 21. A according to claim 18 formed from a quartz refractory composition consisting essentially of silica with an average particle size of from 1 to 8 microns and micronized dispersible particles of a water-insoluble aluminum-oxide precursor, said glass product having a modulus of rupture at 25° C. of at least 1000 kilograms per square centimeter.

22. A product according to claim 21 comprising a transparent glass made by slip casting from a homogeneous slurry containing said quartz refractory composition to form a porous silica preform which is dried and sintered to coalesce the silica particles.

23. A product according to claim 18 comprising a transparent crucible for use in growing silicon monocrystal, the glass of said crucible having a purity of at least 99.99 percent, containing no more than one percent by weight of cristobalite, and containing a concentration of cristobalite nuclei such that a major portion by weight of the vitreous silica is converted to cristobalite when the crucible is heated for 3 hours at a temperature of 1400° C.

24. A refractory product according to claim 18, wherein said quartz glass is formed from a refractory composition comprising micronized particles of vitreous silica and micronized dispersible particles of a water-insoluble aluminum compound that provides the glass with at least 0.005 percent by weight of evenly dispersed aluminum ions.

25. A refractory product according to claim 24 comprising a molded core for metal casting.

26. A process for making a quartz glass article with high thermal shock resistance comprising providing a refractory composition consisting essentially of fine particles of fused quartz and from about 1 to about 4 percent by weight of micronized particles of high-purity alpha cristobalite, shaping said composition to form a silica body with a porosity of at least 10 volume percent, heating and shaping the silica body to coalesce the particles and to form a shaped glass body having a high concentration of internal cristobalite nuclei evenly distributed throughout the glass, the heating of the silica being controlled to provide an essentially vitreous quartz 27. A process according to claim 26, wherein the alpha cristobalite particles provide a concentration of evenly distributed nucleation sites such that a major portion of the glass can be converted from vitreous silica to cristobalite if the crucible is heated for 2 hours at 1400° C.

28. An aqueous homogeneous slurry suitable for slip casting of quartz glass products made from a quartz refractory composition consisting essentially of fused quartz particles having an average particle size of from 1 to 10 microns and a small amount of added micronized dispersible particles of crystalline silica having an average particle size of from 1 to 8 microns, said dispersible particles being maintained in suspension and evenly dispersed throughout the slurry to provide the quartz glass product with a high concentration of evenly dispersed cristobalite nuclei.

* * * * *